United States Patent [19]

Bensoussan et al.

[11] Patent Number: 4,664,940
[45] Date of Patent: May 12, 1987

[54] PROCESS FOR THE FORMATION OF A FLUX OF ATOMS AND ITS USE IN AN ATOMIC BEAM EPITAXY PROCESS

[76] Inventors: Marcel Bensoussan, 881 Cours Aquitaine, Boulogne 92100; Jean-Marie M. Moison, 8, Allée de la Belle-Issue, Croissy/Seine 78290, both of France

[21] Appl. No.: 678,550
[22] PCT Filed: Mar. 6, 1984
[86] PCT No.: PCT/FR84/00052
 § 371 Date: Nov. 2, 1984
 § 102(e) Date: Nov. 2, 1984
[87] PCT Pub. No.: WO84/03524
 PCT Pub. Date: Sep. 13, 1984

[30] Foreign Application Priority Data

Mar. 7, 1983 [FR] France .................. 83 03691

[51] Int. Cl.$^4$ .............................................. B05D 5/12
[52] U.S. Cl. ................................. 427/53.1; 427/85; 427/86; 118/641; 219/121 L
[58] Field of Search .... 219/121 L, 121 LM, 121 LA, 219/121 LB; 427/53.1, 86, 85

[56] References Cited

U.S. PATENT DOCUMENTS

| 4,463,028 | 7/1984 | Laude ............................ 427/53.1 |
| 4,511,595 | 4/1985 | Inoue ........................... 427/53.1 X |
| 4,529,617 | 7/1985 | Chenevas-Paule et al. ....... 427/53.1 |

Primary Examiner—Thurman K. Page
Attorney, Agent, or Firm—Oblon, Fisher, Spivak, McClelland & Maier

[57] ABSTRACT

A process for forming a flux of atoms of an element which includes the forming of a target made up of the element and the irradiation of the target by a pulsed laser whose energy density per pulse is equal to or greater than the emission threshold of the atoms of the elements, but which energy density is below the ablation threshold of either one of the element or the compound which forms the target. The process also relates to the deposition of an insulating, semiconductor or metallic layer of an element or a binary, ternary or quaternary compound which is optionally doped and which utilizes the steps of a heating of a substrate and the growing on the heated substrate of an epitaxial layer of either the element or the compound from at least one atomic flux. The atomic flux is produced by irradiating of a target through the use of a pulsed laser.

18 Claims, 1 Drawing Figure

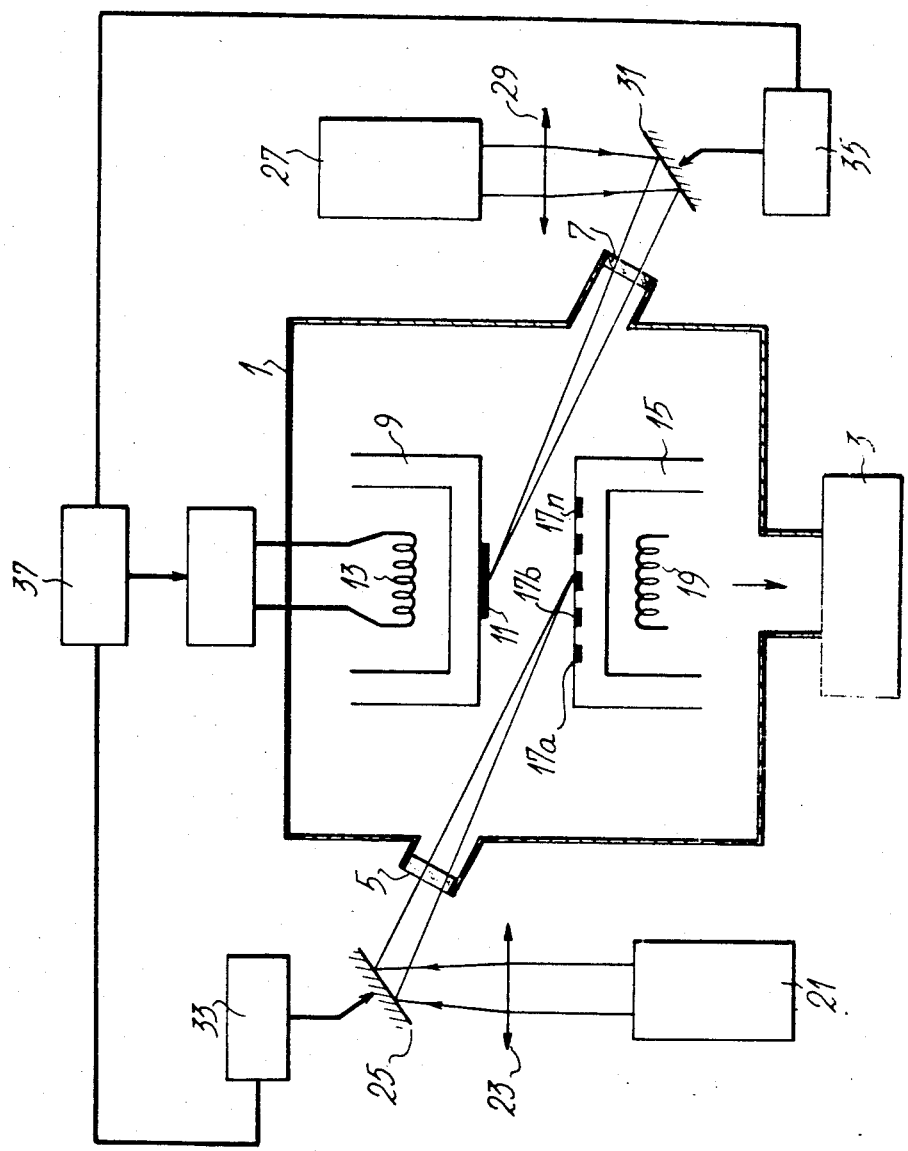

PROCESS FOR THE FORMATION OF A FLUX OF ATOMS AND ITS USE IN AN ATOMIC BEAM EPITAXY PROCESS

The present invention relates to a process for the formation of a flux of atoms of an element, which is more particularly usable in a process and an apparatus for the deposition by epitaxy or deposition under ultravacuum of layers based on III-V semiconductors or their ternary and quaternary derivatives.

For some years now, the development of components for optoelectronics and microelectronics has required the formation of thin layers based on III-V semiconductors or their ternary and quaternary derivatives. Generally, such layers are produced by epitaxy on a binary substrate and the presently used epitaxy procedures are liquid phase epitaxy, vapour phase chemical epitaxy and molecular beam epitaxy. The latter has intrinsically higher performance levels, particularly for obtaining very thin layers having e.g. a thickness of a few Å, which are also very flat, have a widely varying stoichiometry and have very abrupt interfaces. However, the development of this procedure of deposition by epitaxy remains difficult and causes certain problems, because it is difficult to avoid contamination of the layer and to accurately check the incorporation of the doping elements and the elements of group V of the periodic classification of elements.

In this epitaxy procedure, the molecular beams of element V, e.g. P or As, are formed either by using a Knudsen cell containing the solid element or one of its compounds, or by using gases decomposed in situ and as described in the documents: S. L. Wright and H. Kroemer, J. Vac. Sci. Technol 20(2), 143 (1982) M. B. Panish, J. Electrochem. Soc. 127(12), 2729 (1981) and A. L. Cawa Appl. Phys. Lett. 38(9) 701 (1981). In such methods, the element of group III is brought onto the substrate in the form of an atomic beam or a molecular beam obtained by heating a crucible containing the said element in the pure state. Therefore, these methods have certain disadvantages due either to the complexity of the growth equipment, or to the presence of hot furnaces in the deposition enclosure, which produces a difficultly controllable contamination. However, in view of the fact that certain chemical species are brought onto the substrate in the form of molecules, whereas other species are brought in the form of atoms, the superficial reaction of the beam with the substrate is complex and is often the origin of unintentional doping or the creation of deep centres.

For the deposition of layers of compound III-V, such as GaAs, the use of pulsed lasers has also been considered for producing GaAs films from a GaAs target, as described in the article: Crystal Research and Technology Vol. 16, No. 8, 1981, pp. 887–891.

However, under the conditions described in this article, it is not possible to obtain a beam of atoms of element V and this does not make it possible to eliminate the complex reactions referred to hereinbefore with respect to the substrate.

The present invention relates to a process for the formation of a flux of atoms of an element, which can more particularly be used for the deposition of layers by epitaxy or by deposition under an ultravacuum, in order to obviate the disadvantages referred to hereinbefore.

The inventive process for forming a flux of atoms of an element is characterized in that it consists of irradiating a target constituted by a compound of said elements by means of a pulsed laser, whose energy density by pulse is at least equal to the emission threshold of atoms of said element and is below the ablation threshold of said element or said compound.

Thus, by appropriately choosing the energy and pulse duration of the laser used, it is possible to extract a target constituted by a compound of an element, a flux essentially constituted by atoms of said element. It was known that by irradiating a solid target with a high power laser beam, a vaporization on the target surface was obtained, together with a desorption of the atoms constituting the same in the form of different atom groups. When the target is irradiated by means of a continuous laser, the target surface is heated and the particles extracted therefrom are equivalent to those which would be obtained with conventional heating. However when using a pulsed laser, enormous temperature gradients are developed in the target during very short times, for example temperature rises and falls of $10^{10}$ to $10^{140}$ K/s and by appropriately monitoring the energy density per pulse of the laser, it is possible to extract the element or only one of the elements constituting the target, in the form of a beam of atoms and/or ions. Moreover, in the case of a pulsed laser, specific reactions can be induced, because it is possible to temporarily exceed the energy density, which would not be possible during continuous irradiation.

Advantageously, the pulsed laser pulse time is regulated to a value at the most equal to 1 μs.

On irradiating a GaAs target with a pulsed laser, whose energy density is beyond the upper ablation threshold of the element, a beam is obtained both with gallium and arsenic, gallium predominating as is indicated in the article in Crystal Research and technology, Vol.16, No. 8, 1981.

According to the invention, lower energy densities per pulse are used, so as to remain within operating conditions where only atoms of one of the elements of the compound forming the target are emitted and these atoms are ejected prior to their regrouping as molecules.

It is pointed out that the ablation threshold of the element or the compound of the element constituting the target corresponds to the emission of different species (atoms, molecules and/or ions) as from the target.

According to a preferred embodiment of the invention, the element is an element of group V of the periodic classification of elements and the target is constituted by a binary compound of said element of type III-V. When the element is phosphorus, the target can be of InP or GaO. When the element is arsenic, the target is of GaAs.

As has been seen hereinbefore, the energy density per pulse must be at least equal to the emission threshold of the atoms of element V and remain below the ablation threshold of element V or the compound of element V. These thresholds are dependent on the nature of For example, when using an InP target, the lower threshold for the emission of phosphorus atoms from this target is 0.2 J/cm$^2$ and the upper ablation threshold is approximately 1.6 J/cm$^2$. In the case of GaAs target, the lower threshold for the emission of arsenic atoms is 0.5 J/cm$^2$ and the upper ablation threshold is approximately 1.8 J/cm$^2$.

Thus, according to the invention, the energy density per pulse of the pulsed laser is regulated to a value between these two thresholds and the choice of this value is dependent on the growth rate which it is desired to obtain.

Thus, the energy density of the laser influences the vaporization speed of the target. Thus, in the case of an InP target, there is a vaporization rate of $5.10^{13}$ phosphorus atoms/cm$^2$.s for an energy density per pulse of 0.3 J/cm$^2$.

The pulsed lasers which can be used can be of widely varying types. For example, reference is made to YAG lasers, double YAG lasers, ruby lasers and the like as well as U.V. lasers.

Thus, for example, by using a pulsed laser supplying pulses of approximately 0.3 J/cm$^2$ for a few nanoseconds, it is possible to obtain an atomic flux of an element of group V of the periodic classification of elements by irradiating a target formed from a III-V compound of said element.

The invention also relates to a process for deposition by epitaxy of an insulating, semiconducting or metallic layer of an element, or a binary, ternary or quaternary and optionally doped compounds, e.g. a semiconductor compound of type III-V, such as InP, GaP, GaAs, a metal or an insulating compound.

This process consists of growing on a heated substrate an epitaxial layer of said element or compound from one or more atomic fluxes, whereof at least one is produced by the irradiation of the target by means of a pulsed laser.

When the layer to be deposited is a layer of type III-V binary compound or one of its ternary or quaternary derivatives, the atomic flux of element V is formed by irradiation by means of a pulsed laser of a target of III-V compound by using an energy density per pulse at least equal to the emission threshold of atoms of element V and below the ablation threshold of element V or the compound of element V. It is also possible to form the atomic flux of element III by irradiation of a target constituted by element III by means of a pulsed laser.

However, the laser irradiation can be solely used for forming the atomic flux of element V and for forming the atomic flux of element III by conventional procedures, e.g. using an evaporation cell.

A certain number of advantages result from the use of atomic beams instead of molecular beams for epitaxy. Firstly, atomic fluxes are very reactive and cause fewer problems in connection with their incorporation into the substrate. Moreover, the use of a pulsed laser obviates contamination problems due to the heating of the targets or evaporation crucibles by conventional means. Thus, when a pulse laser is used, the substrate becomes the hottest point of the deposition enclosure and it is consequently possible to simplify the thermal protection and the pumping systems. Contamination of the crucible which is generally in contact with the source is also prevented and as a result of the fact that the source remains cold during the exaporation, problems due to corrosion, alloying or degassing of the crucible are prevented. It is also possible to obtain an easy and fast monitoring of the flux by simply acting on the laser beam and the problems of bringing to the right temperature and balancing crucibles containing the targets are also eliminated, which makes it possible to bring about a by no means negligible time saving.

Finally, the atomic beam epitaxy process makes it possible to check the thickness of the deposit on the scale of a monolayer, as in molecular beam epitaxy processes.

According to the invention, it is also possible to introduce into the epitaxial layer, a doping element by directing a beam of atoms or ions of said doping element fommed by irradiation of a target thereof or a compound thereof by means of a pulsed laser onto the heated target. In this case, if it is wished to solely use an ion beam, it is possible to isolate the ions emitted by using means for deflecting and optionally accelerating the ions of the beam extracted from the target by irradiation by means of the pulsed laser.

Thus, during the irradiation of the target by a pulsed laser, the extracted beam contains a by no means negligible ion proportion, representing approximately 1/1000 of the observed flux and it is possible to isolate these by using appropriate electrical fields for obtaining in this way a source of doping elements.

Since it is also possible by using a pulse laser to deposit a layer of a metal or an insulant, it is also possible to form in the same system a discrete component necessitating the superimposing of several different types of layers, or even an integrated circuit.

The invention also relates to an atomic beam epitaxy apparatus wherein it comprises a tight enclosure having means for supporting a substrate to undergo epitaxy, means for heating the substrate and means for supporting a series of targets of the elements and/or the compounds of the elements to form the epitaxial layer, a pulse laser, means for directing and focusing the beam of a pulsed layer onto at least one of the targets in the enclosure and means for heating said targets to ensure their regeneration.

Thus, following irradiation by a pulsed laser, the surfaces of the target constituted by a binary compound are enriched with one of the elements of the compound and it is necessary to regenerate them in order to be able to continue deposition. This can be carried out by heating targets to moderate temperatures of approximately 100° C. Preferably, the substrate heating means comprise a laser.

The apparatus according to the invention in particular has the advantage of permitting the simultaneous emission of several atomic beams of the different elements which will form the epitaxial layer. Thus, by using appropriate control and deflection means, it is possible to use a single high power pulse layer focused onto and scanning the different targets in order in this way to obtain simultaneous fluxes of several elements. The intensity of the fluxes can be imposed either by a modulation of the laser intensity, or by a modulation of the time passed on each target. Thus, the epitaxy deposition apparatus according to the invention is much less complex than molecular beam epitaxy apparatuses. It can also have a smaller size and it is possible to successively use the same laser on several deposition enclosures. It is also possible to use the laser for carrying out the preliminary substrate cleaning operations. In addition, the apparatus according to the invention has an inherent flexibility and cleanness, which makes it possible to increase the quality and definition of the deposited layers, which can be of a very varied nature.

According to the invention, it is also possible to carry out a selective epitaxy or a lateral variation of the composition of the layer during growth by modifying the heating of the substrate surface by means of energy beams, such as an electron beam or a laser beam, so as to modify the temperature on the substrate surface. Thus, according to a special embodiment of the epitaxy process according to the invention, the substrate is heated by means of an energy beam, in such a way that the temperature on the substrate surface is modified, certain zones of the substrate being raised to a temperature T and the other zones of the substrate being raised to a temperature T+ΔT. In accordance with the need, the temperature T can be obtained by heating the substrate in a conventional manner.

This temperature modification can also be brought about by forming an interference pattern, a diffraction pattern or the image of a mask on the surface of the substrate and on the basis of said beam.

This temperature modification can also be obtained by displacing the same beam on the substrate surface and by modifying the power of the beam synchronously with the displacement. However, in this case, it is necessary for the beam displacement rate to be higher than the thermal diffusion rate.

According to the invention, the temperature variation ΔT is such that the temperature T+ΔT cprresponds to a zero growth rate of the epitaxial layer.

It is pointed out that during epitaxy, the flux of atoms or molecules $J_0$ is directed onto the heated substrate, which is raised to a high temperature, e.g. of approximately 600° C. in the case of a GaAs substrate. Under these conditions, there is a thermal desorption on the substrate with a flux $J_1$, which is dependent on the temperature T to which the substrate is raised. The growth rate V is proportional to $(J_0-J_1)$ and is consequently dependent on T. Thus, for higher temperatures, $J_1$ can assume a value higher than $J_0$ and the growth rate can become negative. On modifying T, $J_1$ is modified and consequently so is the growth rate V.

In addition, when it is wished to carry out a selective epitaxy on the substrate, i.e. to only deposit the epitaxial layer on certain zones thereof, it is adequate if there is a higher temperature in the zones of the substrates not to carry the layers, corresponding to a zero growth rate.

It is also possible to choose the temperature variation ΔT in such a way as to obtain a different composition within the layer between the zones heated to temperatures T+ΔT and those heated to temperature T.

Thus, during the growth of a binary, ternary, or quaternary compound, the behaviour of the epitaxial layer is critically dependent on the substrate surface temperature and this is within very narrow temperature ranges, due to the thermal desorption of the constituents of the layer not occurring in the same temperatures. Therefore, it is possible to choose a temperature for which the desorption of one of the constituents of the layer is higher, which leads to the layer being depleted in this constituent.

Thus, during the epitaxial deposition of GaAlAs on a GaAs substrate, the thermal desorption of Ga takes place at lower temperatures than that of Al and consequently a temperature rise leads to a Ga depletion in the deposited layer. The same occurs during the epitaxial deposition of an InAlAs layer.

Thus, a carefully controlled modification of the substrate surface temperature leads to a modification in the component composition of the layer undergoing epitaxy. In all cases, the temperature modification of the surface of the substrate can be obtained by means of a continuous laser or a pulsed laser.

When a continuous laser is used for heating the substrate, it is possible to obtain this temperature difference by modifying the illumination of the substrate surface as a function of the patterns which it is wished to obtain.

For example, when the epitaxial patterns must reproduce a grating or network of spacing $x_o$, it is possible to conventionally heat the substrate to temperature $T_o$ and impose a supplementary temperature modification of period or cycle $x_0$ and amplitude ΔT adequate for bringing about growth in accordance with the sought pattern, this amounts to modifying the power of the continuous laser deposited on the substrate with the period $X_o$ by an optical apparatus by e.g. effecting a diffraction or interference pattern or using a mask, in such a way that said power varies in the following manner:

$$P = P_{max.} \cos 2\pi \cdot \frac{x}{x_0}$$

In the case of a continuous laser, at thermal equilibrium and in a simple model, the modification of temperature ΔT corresponds essentially to:

$$P_{max.} \cdot \frac{\alpha x_o^2}{4\pi^2 K}$$

with α representing the light absorption coefficient and K the thermal conductivity of the substrate. For example, taking the case of a GaAs substrate, we obtain $\alpha=10^5 cm^{-1}$ and $K=0,13 W\cdot cm^{-1}\cdot K^{-1}$.

Thus, on wishing to obtain a resolution of 10 μm, the temperature different ΔT(K) between the different zones of the substrate must be 0.02 ΔP(W). In the case of a GaAs substrate, where ΔT must be approximately 40°K and T 670° C. in order to completely cancel out the growth on the heated substrate zones at a temperature above 710° C., the power difference ΔP of the laser must exceed $5.10^3 W/cm^2$.

This can be obtained, but the optical damage threshold of the GaAs substrate is reached, because said threshold is approximately $10^4 W/cm^2$. Thus, on using a continuous laser, the spacing of the network must be limited to 3 μm in order not to exceed the $10^4 W/cm^2$ threshold.

However, on using a pulsed laser not only for heating the substrate, but also in a synchronous manner for forming atomic beams of the elements of the layer to undergo epitaxy, the thermal equilibrium by heat diffusion from the hotter zones to the cooler zones does not have time to take place during deposition if the deposition time and heating time t is less than $x_0^2/D$, in which D represents the thermal diffusivity and x the spacing of the grating or network. Under these conditions, the temperature modification is directly proportional to the modification of the energy density F (J/cm²) and ΔT is equal to ΔF·(Dα/K).

For GaAs, we obtain $\alpha=10^5 cm^{-1}$, $K=0,13$ $W.cm^{-1}.K^{-1}$ and D.0.05 cm²/s.

Under these conditions, in order to obtain a 40° C. temperature change, the energy density modification of the laser must be $10^{-3} J/cm^2$. This is 100 times below the optical damage threshold of the substrate (0.1 J/cm²) and consequently the temperature modification is more easily obtained by using a pulsed laser rather than a continuous laser.

Moreover, the only limitation with regards to the spacing of network $x_o$ is that $x_o$ is less than $\sqrt{D.t}$. If a rapid source is used, t is essentially $10^{-8}$s, so that $x_o$ can reach 0.3 μm, which constitutes the limit of the geometrical optics for standard lasers. Thus, it is possible to obtain a much better resolution by using a pulsed laser coupled with a pulsed source.

In the case where it is wished to modify the composition of a GaAlAs layer from $Ga_{1-y}Al_yAs$ to $Ga_{1-y-0.1}Al_{y+0.1}As$, on the basis of a network of spacing $x_0 = 10$ μm, the temperature difference $\Delta T$ must be 5° above T=690° C. Thus, the $\Delta T$ necessary is relatively small to ensure that there is no a simultaneous large change in the growth rate. In this case, on using a continuous laser, the laser power difference $\Delta P$ must exceed $2 \cdot 10^2$ W/cm². In order not to exceed the optical damage threshold of $10^4$ W/cm² in the case of a continuous laser the spacing must be limited to 0.7 μm.

On using a pulse laser, the laser energy modification must be $1.5 \cdot 10^{-4}$ J/cm², which is 800 times below the optical damage threshold of the substrate (0.1 J/cm²). Thus, as has been seen hereinbefore, it is possible to obtain a better resolution by using a pulsed laser.

BRIEF DESCRIPTION OF THE DRAWING

Other features and advantages of the invention can be better gathered from reading the following description, given in an illustrative and non-limitative manner, with reference to the attached sole FIGURE of the present invention, showing an epitaxy apparatus according to the invention.

DESCRIPTION OF THE PREFERRED EMBODIMENT

In the drawing, it is possible to see that the epitaxy apparatus comprises a tight enclosure 1, which can be placed under vacuum by using pumping means 3. This enclosure is provided with a first transparent shield window 5 and a second transparent shield window 7. Within the enclosure, a support 9 receives the substrate 11 to undergo epitaxy. Substrate 11 can be raised to the appropriate temperature by heating means 13.

Facing substrate 11, a second support 15 receives a plurality of targets 17a, 17b . . . . 17n and these targets can be heated by heating means 19. Outside the enclosure, a first pulse laser 21, whose beam can be focused and directed onto targets 17a, 17b . . . . 17n is used for the formation of the atomic beams necessary for epitaxy. With this objective, pulsed laser 21 is associated with a lens 23 and a mirror 25, whose orientation can be modified according to an appropriate programme, in order to direct the beam onto target 17a, 17b . . . . 17n and to successively scan the surface of one or more of these targets.

The apparatus can also comprise a second laser 27, which can be a pulsed laser or a continuous laser and which is used for heating substrate 11. In the same way, the laser is associated with a lens 29 and a mirror 31, whose orientation can be modified as a function of time in order to direct the laser beam through the shield window 7 onto substrate 11 and scan the surface of the latter.

The respective control means 33 and 35 for mirrors 25 and 31 can be programmed by a computer or microprocessor 37. In the same way, it is possible to use a microprocessor for programming the substrate heating furnace 13 and mirror 25.

In an apparatus of this type, it is possible to deposit a GaAs epitaxial layer by using targets made from gallium and GaAs and a pulsed laser focused on a 1 cm² surface S with an energy density per pulse of 1 J/cm², a pulse time of 20 nanoseconds and a pulse frequency f of 10 Hz, the distance d between substrate 11 and targets 17 being 1 cm.

Under these conditions, the density of arsenic atoms emitted during each pulse is $10^{14}$ atoms or arsenic /cm². The growth V(cm.s$^{-1}$) is equal to $D.S.f/\pi d^2 N$ with N representing the number of atoms per cm³ in the film, which is $2.2 \cdot 10^{22}$ cm$^{-3}$ in the case of GaAs.

Thus, a growth rate equal to $1.5 \cdot 10^{-8}$ cm/s or 0.5 μm/h is obtained, which is comparable with that obtained by carrying out epitaxy with molecular beams.

In order to obtain this growth, firstly the vacuum is formed in enclosure 1 in order to reach approximately $10^{-10}$ Torr. This is followed by the starting up of heating means 13, in order to raise the GaAs substrate to a temperature of approximately 600° C. and laser 21 is regulated in such a way that it scans the GaAs target and the gallium target with pulses of desired frequency and energy in order to simultaneous extract a beam of arsenic atoms and a beam of gallium atoms. Thus, a GaAs layer is grown on substrate 11.

This apparatus can also be used for the epitaxial growth of InP. Under these conditions, the phosphorus target is constituted by a InP (100)monocrystal and a pulsed laser with a colouring agent or dye is used with a wavelength close to 5400 Å and an energy of approximately 2.3 eV. The laser beam is focused so as to obtain peak power levels of approximately 200 MW/cm² with a pulse duration of 5 nanoseconds and a frequency of 20 Hz, i.e. an energy density per pulse of 1 J/cm². Under these conditions, a flux is obtained which is constituted by at least 95% atomic phosphorus and is possible to obtain a desorption level initially corresponding to 10 monolayers per second, i.e. adesorption rate of 10 μm/h.

The growth procedure is the same as that described hereinbefore for GaAs, except that here the InP substrate is raised to a temperature of approximately 300° C. or a temperature of approximately 500° C. in the presence of a phosphorus of arsenic atmosphere.

In all cases, following irradiation of the target, the latter are subject to heating at approximately 100° C. in order to regenerate the surface of the InP or GaAs target. After irradiation and starting with phosphorus or arsenic, the surface is greatly enriched with indium or gallium. However, subsequent heating at 100° C. collects this indium or gallium excess into macroscopic islands, the surface between the islands being identical to the initial surface, which is consequently adequate for regenerating the target.

We claim:

1. Process for the formation of a flux of atoms of an element, comprising the steps of:
    forming a target constituted by a compound of said element;
    irradiating said target by means of a pulsed laser, whose energy density per pulse is at least equal to the emission threshold of the atoms of said element and is below the ablation threshold of one of said element and said compound.

2. Process according to claim 1, characterized in that the pulse duration of said pulsed laser is regulated to a value at the most equal to 1 microsecond.

3. Process according to either of the claims 1 and 2, characterized in that the element is an element of group V of the periodic classification of elements of the periodic classification of elements and in that the target is constituted by a binary compound of type III-V.

4. Process according to claim 3, characterized in that said element is phosphorus.

5. Process according to claim 4, characterized in that the target is of InP.

6. Process according to claim 4, characterized in that the target is of GaP.

7. Process according to claim 3, characterized in that the element is arsenic.

8. Process according to claim 7, characterized in that the target is constituted by GaAs.

9. Process for deposition by epitaxy of an insulating, semiconductor or metalic layer of an element, or a binary, ternary or quaternary compound which is optionally doped, comprising the steps of:
   heating a substrate; and
   growing on said heated substrate an epitaxial layer of one of said element and compound from at least one atom flux, whereof at least one atomic flux is produced by irradiating a target by means of a pulsed laser.

10. Process according to claim 9, characterized in that the epitaxial semiconductor layer is based on a III-V semiconductor or one of its ternary or quaternary derivatives.

11. Process according to claim 10, characterized in that an atomic flux of element III is formed by irradiating a target of element III by means of a pulsed laser.

12. Process according to any one of the claims 9 to 11, characterized in that a doping element is introduced into the epitaxial layer by directing a beam of atoms and/or ions of said doping element formed by the irradiation of a target of said element or a compound of said element by means of a pulsed laser onto the heated substrate.

13. Process according to one of the claims 9 to 11, characterized in that the substrate is heated by means of an energy beam, so as to bring about a modification of the temperature of the substrate surface, certain zones of the substrate being raised to a temperature T, whilst the other zones of the substrate are raised to a temperature $T + \Delta Y$.

14. Process according to claim 13, characterized in that this temperature modification is obtained by forming an interference pattern, a diffraction pattern or the image of a mask on the surface of the substrate and on the basis of said beam.

15. Process according to claim 13, characterized in that said temperature modification is obtained by displacing the beam on the surface of the substrate and by modifying the power of said beam synchronously with the displacement.

16. Process according to claim 13, characterized in that the temperature variation $\Delta T$ is such that the temperature $T + \Delta T$ corresponds to a zero growth rate of the epitaxial layer.

17. Process according to claim 13, characterized in that the temperature variation $\Delta T$ in such that the composition of the layer differs between the zones heated to temperature $T + \Delta T$ and the zones heated to temperature T.

18. Process according claim 3, characterized in that the beam is constituted by a pulsed laser.

* * * * *